United States Patent
Su

(10) Patent No.: US 10,580,683 B2
(45) Date of Patent: Mar. 3, 2020

(54) VAPOR DEPOSITION APPARATUS

(71) Applicant: BOE TECHNOLOGY GROUP CO., LTD., Beijing (CN)

(72) Inventor: Zhiwei Su, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 764 days.

(21) Appl. No.: 15/159,156

(22) Filed: May 19, 2016

(65) Prior Publication Data

US 2016/0376703 A1    Dec. 29, 2016

(30) Foreign Application Priority Data

Jun. 26, 2015 (CN) .......................... 2015 1 0364626

(51) Int. Cl.
| | |
|---|---|
| H01L 21/687 | (2006.01) |
| C23C 16/458 | (2006.01) |
| C23C 16/04 | (2006.01) |
| C23C 14/04 | (2006.01) |

(52) U.S. Cl.
CPC ...... H01L 21/68728 (2013.01); *C23C 14/042* (2013.01); *C23C 16/042* (2013.01); *C23C 16/4585* (2013.01)

(58) Field of Classification Search
CPC .......... H01L 21/68728; C23C 16/4585; C23C 16/042; C23C 14/042
See application file for complete search history.

(56) References Cited

U.S. PATENT DOCUMENTS

| | | | | |
|---|---|---|---|---|
| 3,314,395 A | * | 4/1967 | Hemmer ............... | C23C 14/042 118/721 |
| 5,134,640 A | * | 7/1992 | Hirokawa ........... | G03F 7/70075 378/161 |
| 5,534,969 A | * | 7/1996 | Miyake ................. | G03F 7/707 250/559.3 |
| 5,624,722 A | * | 4/1997 | Nagaishi ............... | C23C 14/087 118/50.1 |

(Continued)

FOREIGN PATENT DOCUMENTS

| | | | | |
|---|---|---|---|---|
| CN | 103839864 | * | 6/2014 | ............. C23C 14/04 |
| CN | 103839864 A | | 6/2014 | |

OTHER PUBLICATIONS

Chinese Office Action dated Jan. 4, 2017.

*Primary Examiner* — Jeffrie R Lund
(74) *Attorney, Agent, or Firm* — Dilworth & Barrese, LLP.; Michael J. Musella, Esq.

(57) ABSTRACT

A vapor deposition apparatus comprises a vacuum chamber, at least two movable holders and an alignment system. A pedestal, a backboard supported on the pedestal and a metal mask located above the backboard are disposed inside the vacuum chamber, wherein an anti-plasma coated layer is provided on the metal mask; each of the movable holders is configured to clamp an end of the metal mask on which a pulling force can be applied; and the alignment system is configured to drive the movable holders to move in at least one direction of a first direction and a second direction that are perpendicular to each other within a plane in parallel to the backboard and a third direction perpendicular to the plane to perform at least one of applying a pulling force on the metal mask and attaching the metal mask onto a preset location of the backboard.

6 Claims, 3 Drawing Sheets

(56) References Cited

U.S. PATENT DOCUMENTS

| | | | | |
|---|---|---|---|---|
| 10,422,029 | B2* | 9/2019 | Kishimoto | C23C 14/24 |
| 2001/0030747 | A1* | 10/2001 | Hoover | G02B 7/16 |
| | | | | 356/400 |
| 2002/0075469 | A1* | 6/2002 | Tanaka | G03F 7/70716 |
| | | | | 355/72 |
| 2004/0031936 | A1* | 2/2004 | Oi | H01J 37/244 |
| | | | | 250/492.23 |
| 2007/0032082 | A1* | 2/2007 | Ramaswamy | G03F 1/54 |
| | | | | 438/689 |
| 2009/0207395 | A1* | 8/2009 | Kasono | B82Y 10/00 |
| | | | | 355/67 |
| 2011/0032505 | A1* | 2/2011 | Lansbergen | G03F 7/70741 |
| | | | | 355/73 |
| 2012/0183676 | A1* | 7/2012 | Sonoda | C23C 14/042 |
| | | | | 427/8 |
| 2012/0228261 | A1* | 9/2012 | Watanabe | G03F 7/40 |
| | | | | 216/41 |
| 2014/0291619 | A1* | 10/2014 | Lee | C23C 14/042 |
| | | | | 257/40 |
| 2016/0376703 | A1* | 12/2016 | Su | C23C 16/4585 |
| | | | | 118/729 |
| 2017/0009343 | A1* | 1/2017 | Cho | C23C 16/45544 |
| 2017/0011921 | A1* | 1/2017 | Shibagaki | H01L 21/3247 |
| 2018/0030596 | A1* | 2/2018 | Vercesi | C23C 14/042 |
| 2019/0013229 | A1* | 1/2019 | Cho | H01L 21/6831 |
| 2019/0067073 | A1* | 2/2019 | Guan | H01L 21/68707 |
| 2019/0249290 | A1* | 8/2019 | Kishimoto | C23C 14/042 |

* cited by examiner

VAPOR DEPOSITION APPARATUS

TECHNICAL FIELD

Embodiments of the present invention relate to a vapor deposition apparatus.

BACKGROUND

It is necessary for an existing vapor deposition apparatus to include a metal mask disposed between a backboard and a plasma generating source for masking due to a need of preventing from occurrence of a film forming phenomenon at an adhesive-coated zone of the backboard. This is generally realized by welding the metal mask to a stainless steel framework and then placing the stainless steel framework into the vapor deposition apparatus.

However, a metal mask generally made of a ferrum-nickel alloy will react with fluorine ions within a vacuum chamber, which affects a service life of the metal mask. Existing techniques have attempted to overcome the above-mentioned drawbacks by plating a coated layer that resists plasma onto a metal mask upon the metal mask being welded to the stainless steel framework. However, the stainless steel framework is liable to be deformed and then results in a shadow effect on the backboard; furthermore, metal frameworks in different sizes have to be used in cooperation with metal masks in different sizes. This makes the use of such kind of vapor deposition apparatus become cumbersome.

SUMMARY

At least one embodiment of the present invention provides a vapor deposition apparatus, which can decrease an occurrence of a phenomenon of shadow effect on a backboard and also improve an operational convenience.

To achieve the above objects, embodiments of the present invention utilize technical solutions as below.

A vapor deposition apparatus, comprising a vacuum chamber, at least two movable holders and an alignment system. A pedestal, a backboard supported on the pedestal and a metal mask located above the backboard are disposed inside the vacuum chamber, wherein, an anti-plasma coated layer is provided on the metal mask. Each of the movable holders is configured to clamp an end of the metal mask on which a pulling force can be applied. The alignment system is configured to control the movable holders to move in at least one direction of a first direction and a second direction that are perpendicular to each other within a plane in parallel to the backboard and a third direction perpendicular to the plane, so as to perform at least one of applying an pulling force on the metal mask and attaching the metal mask onto a preset location of the backboard.

BRIEF DESCRIPTION OF THE DRAWINGS

In order to clearly illustrate the technical solution of the embodiments of the present invention, the drawings of the embodiments will be briefly described in the following, wherein.

REFERENCE NUMERALS

1—vacuum chamber; 2—backboard; 3—metal mask; 4—pedestal; 5—holder; 51—first splint; 52—second splint; 53—clasp; 6—alignment system; 61—acquiring device; 62—conveying device; 621—base; 622—transmission rod; 623—first motion mechanism; 624—second motion mechanism; 625—third motion mechanism; 626—pressure sensor; 63—control device; 7—corrugated pipe.

DETAILED DESCRIPTION

In order to make objects, technical solutions and advantages of the embodiments of the present invention apparent, the technical solutions of the embodiment will be described in a clearly and fully understandable way in connection with the drawings related to the embodiments of the present invention. It is obvious that the described embodiments are just a part but not all of the embodiments of the present invention. Based on the described embodiments herein, those skilled in the art can obtain other embodiment(s), without any inventive work, which should be within the scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
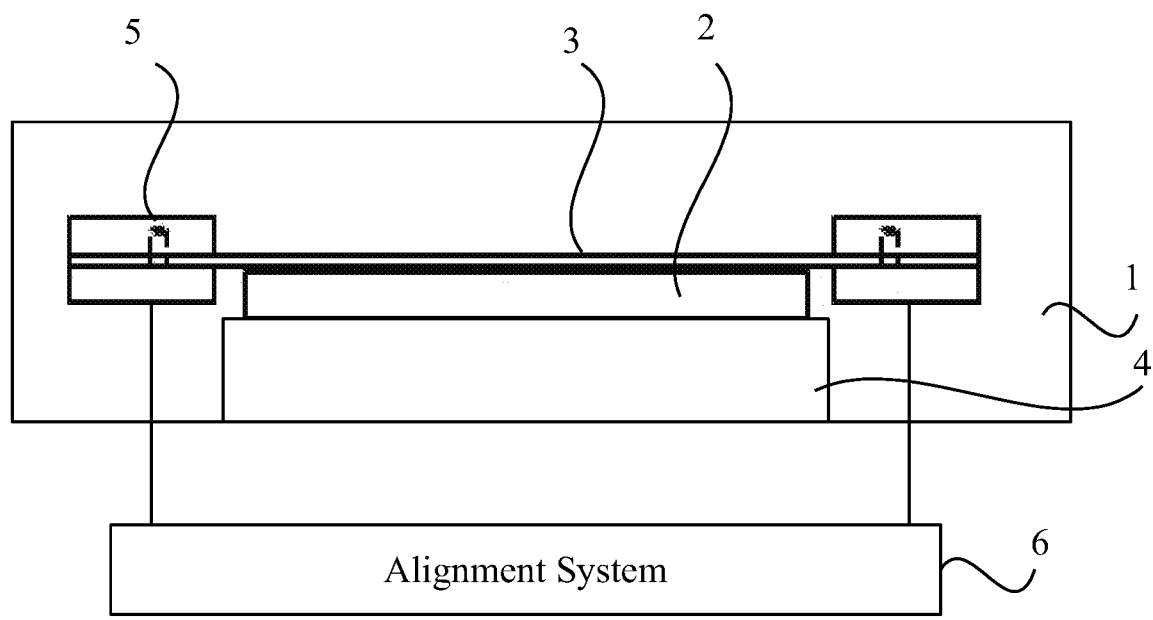
FIG. 1 is a schematically structural view of a vapor deposition apparatus provided by an embodiment of the present invention.

As illustrated in FIG. 1, the structure of the vapor deposition apparatus provided by an embodiment of the invention includes a vacuum chamber 1, at least two holders 5, and an alignment system 6. A pedestal 4, a backboard 2 supported on the pedestal 4 and at least one metal mask 3 located above the backboard 2 are disposed inside the vacuum chamber 1, wherein, an anti-plasma coated layer 31 is provided on the metal mask 3. Each of the holders 5 are configured to hold an end of the metal mask on which a pulling force can be applied. The alignment system 6 is configured to control the movable holders 5 to move in at least one direction of a first direction and a second direction perpendicular to each other in a plane in parallel to the backboard and a third direction perpendicular to the plane, so as to perform at least one of applying a pulling force on the metal mask and attaching the metal mask to a preset location of the backboard.

During use of the vapor deposition apparatus according to the embodiment of the invention, for example, as illustrated in FIG. 1, it is possible that two ends (illustrated as two short sides of the metal mask 3 in the example illustrated in FIG. 1) of the metal mask 3 are held by two holders 5 disposed at two opposite sides of the pedestal 4, respectively; then the two holders 5 are controlled by an alignment system 6 so as to move oppositely along the first direction (illustrated as the horizontal direction in FIG. 1) respectively (namely, the holder 5 initially located at the left side moves to the left along the horizontal direction, while the holder 5 initially located at the right side moves to the right along the horizontal direction) to stretch the metal mask 5; at the meanwhile, the two holders 5, along with the metal mask held there-between, move downwards in the third direction (illustrated as the vertical direction in FIG. 1) to attach the metal mask 3 onto a preset location of the backboard 2.

As above, in the vapor deposition apparatus provided by embodiments of the invention, at least two holders 5 and an alignment system 6 are utilized to replace the stainless steel framework conventionally used in existing technologies, thereby reducing the production cost and also the transportation cost of the stainless steel framework; moreover, occurrence of shadow on the backboard due to deformation of the stainless steel framework can be avoided. Furthermore, both of stretching the metal mask 3 and attaching the metal mask 3 onto the backboard 2 can be achieved by cooperative movements of the at least two holders 5 which are movable so as to correspondingly generate variable clamping distances adaptable to hold metal masks 3 in different sizes; as a result, the defect that the metal framework as used has to be frequently replaced to adapt to different sizes of the metal ask is avoided, and the usage of the vapor deposition apparatus is simplified.

As stated above, with the vapor deposition apparatus provided by embodiments of the invention, the convenience of use is improved, and occurrence of shadow on the backboard is reduced.

It is to be noted that, although only two holders 5 are illustrated as locating at two opposite sides of the pedestal 4 in FIG. 1, during implementation of the vapor deposition apparatus provided by embodiments of the invention, the location and amount of the holders can be set flexibly. For example, commonly used metal masks are known to be rectangular, so in some embodiments it's possible to arrange four holders 5 each serving to clamp one side of the metal mask 3. In this way, the metal mask is deformed under the action of a tension force produced by movements of the holders in both the first direction and the second direction. In some other embodiments it's also possible to arrange three holders so that not only the two short sides of the metal mask 3 can be clamped (as illustrated in FIG. 1) but also a long side.

Figure 2:
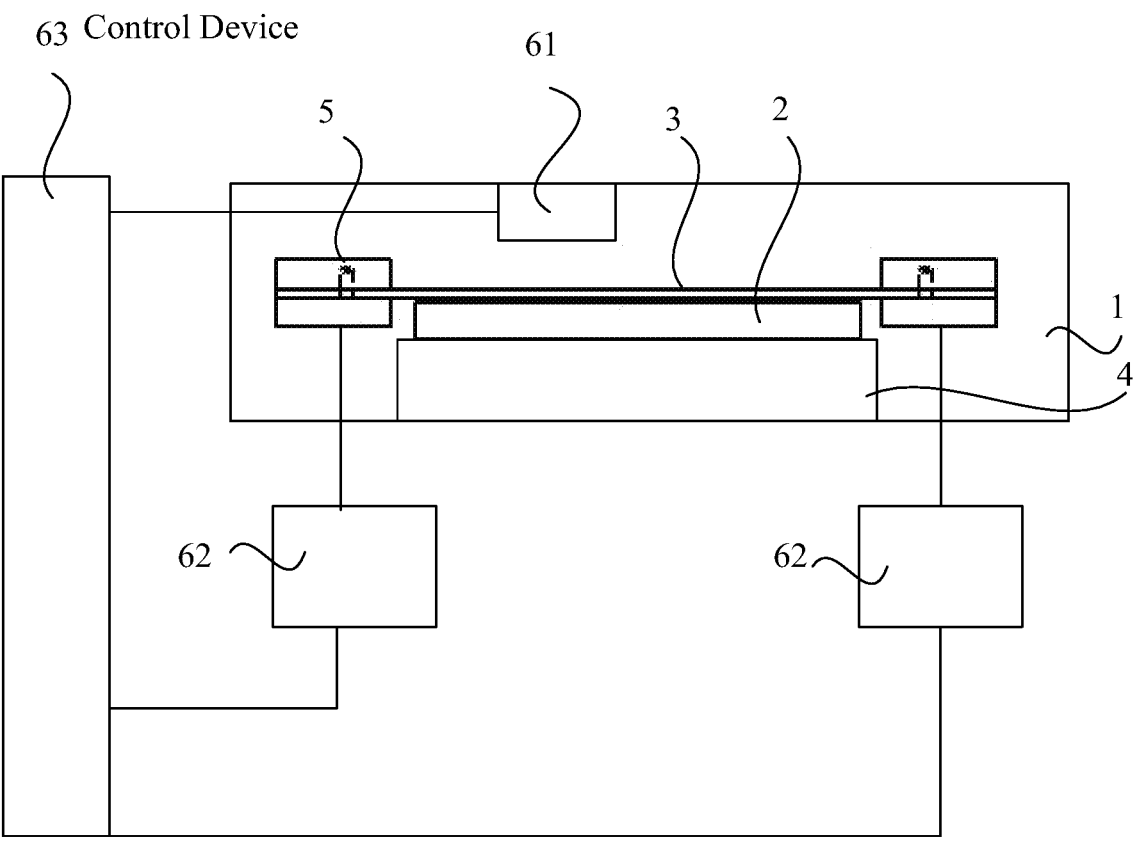
FIG. 2 is another schematically structural view illustrating an example of an alignment system in the vapor deposition apparatus provided by an embodiment of the present invention.

The above-mentioned alignment system 6 in the vapor deposition apparatus provided by embodiments of the invention can have various structures. FIG. 2 is a schematic view illustrating partial structure of an example of the alignment system 6. As illustrated in FIG. 2, the alignment system 6 can include an acquiring device 61, conveying devices 62 and a control device 63.

In this example, the acquiring device 61 is configured to acquire image information of a first alignment mark preset on the backboard 2 and a second alignment mark preset on the metal mask 3.

In this example, the conveying devices 62 are disposed in one-to-one correspondence with the at least two holders 5, each of the conveying devices 62 is configured to control the corresponding holder 5 to move in at least one of a first preset direction, a second preset direction and a third preset direction. As mentioned above, the first preset direction and the second preset direction are perpendicular to each other in a plane in parallel to the pedestal 4, and the third preset direction is perpendicular to the plane.

In this example, the control device 63 is in signal connection with the acquiring device 61 and each of the conveying devices 62, and is configured to control the operation of each of the conveying devices 62 respectively according to the image information as received and a preset tension value input by a user. Under the control of the control device 63, the conveying device 62 can move the metal mask 3 in at least one of the aforesaid three directions by the aid of the holder 5 so as to position the metal mask 3 with respect to the backboard 2 in a desired manner. In addition, by the aid of the holder 5, the conveying device 62 can also stretch the metal mask 3 with an appropriate tension preset by the user, thereby avoiding the metal mask 3 from being pulled-apart and damaged.

The arrangement of the above-mentioned first alignment mark and second alignment mark, the acquiring of the image information of the alignment marks, as well as the setting of the tension value are all technologies well known in the art, and embodiments of the invention do not intend to particularly define any of them herein. Those skilled in the art can make reasonable settings according to industrial needs and practical experiences.

Figure 3:
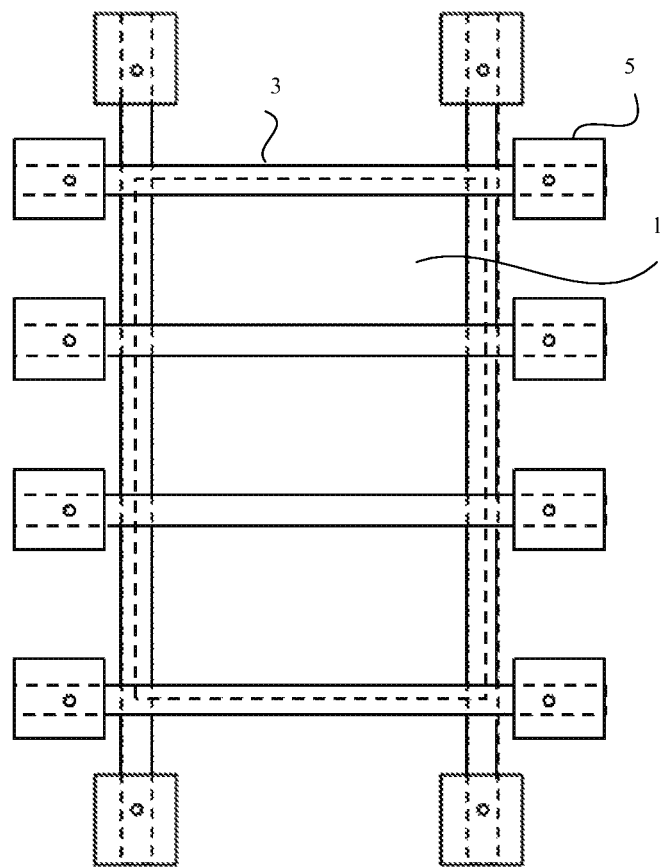
FIG. 3 is still another schematically structural view of a vapor deposition apparatus provided by an embodiment of the present invention in which a plurality of metal masks are disposed.

FIG. 3 is another schematically structural view of the vapor deposition apparatus provided by the embodiment of the invention in which a plurality of metal masks 3 is disposed. Accordingly, the conveying devices 62 can drive the holders 5 to move the plurality of metal masks 3 to desired positions on the backboard 1. For example, as illustrated in FIG. 3, the vapor deposition apparatus includes six metal masks 3, with two short sides of each metal mask 3 being held by two holders 5, respectively. Herein it is to be noted that, regarding structures and arrangements of the alignment system 6 that are not illustrated in FIG. 3, reference can be made to aforesaid relevant descriptions. Also, it should be understood by those skilled in the art that, more or less metal masks 3 and/or holders 5 than those illustrated can be included in other embodiments, as long as it is convenient to implement the clamping operation and movement operation as described in the aforesaid embodiments.

Figure 4:
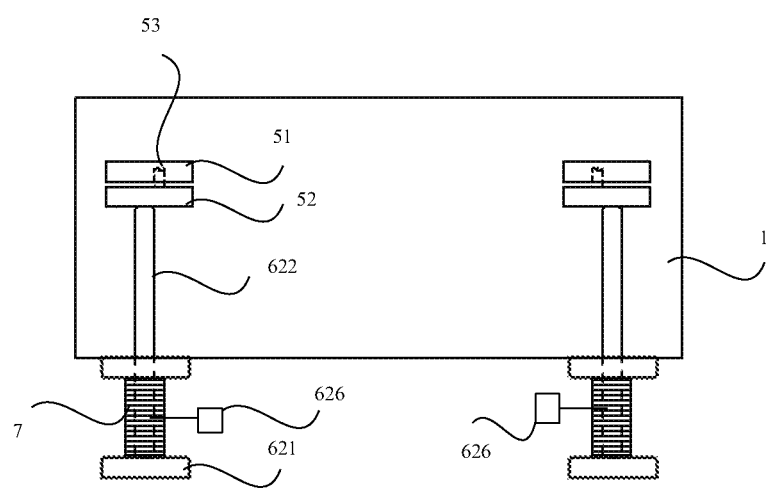
FIG. 4 is yet another schematically structural view illustrating another example of the alignment system in the vapor deposition apparatus provided by an embodiment of the invention.
Figure 5:
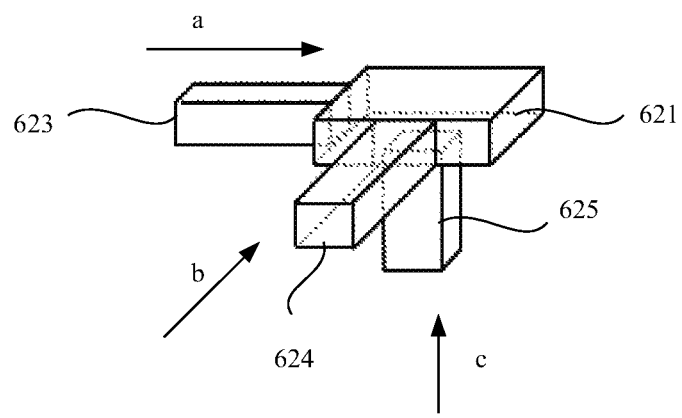
FIG. 5 is a schematically structural view of a conveying device in the vapor deposition apparatus provided by the embodiment of the invention as illustrated in FIG. 4.

FIG. 4 is still another schematically structural view of the vapor deposition apparatus provided by the embodiment of the invention, and FIG. 5 is a schematic view illustrating partial structure of the conveying device in the vapor deposition apparatus illustrated in FIG. 4. Regarding other components that are not illustrated in details by FIG. 4 and FIG. 5, reference can be made to FIG. 1 and FIG. 2.

With reference to FIG. 4 and FIG. 5, in an example, the conveying device 62 includes a base 621; a transmission rod 622 having a first end fixedly connected to the base 621 and a second end fixedly connected to the holder 5; a first motion mechanism 623 mounted on the base 621, configured to drive the base 621 to move in the first preset direction (as indicated by arrow "a" in FIG. 5); a second motion mechanism 624 mounted on the base 621, configured to drive the base 621 to move in the second preset direction (as indicated by arrow "b" in FIG. 5); and a third motion mechanism 625 mounted on the base 621, configured to drive the base 621 to move in the third preset direction (as indicated by arrow "c" in FIG. 5).

In an example, for the convenience of clamping the metal mask 3, each of the holders 5 includes a first splint 51 and a second splint 52 that are disposed in parallel. The first splint 51 is fixedly connected to the second end of the transmission rod 622, and the first splint 51 and the second splint 52 are coupled, for example, by a bayonet and a clasp 53. For example, the bayonet may be arranged on the first splint 51, and the clasp is arranged on the second splint 52; or, the bayonet is arranged on the second splint 52, and the clasp is arranged on the first splint 51.

In an example, a through-hole mated with the clasp is provided on the metal mask 3 so as to facilitate positioning of the metal mask 3 at a suitable location in the holder 5.

In an example, as illustrated in FIG. 5, each of the conveying devices 62 can further include a pressure sensor 626 in signal connection with the control device 63, wherein the pressure sensor 626 is configured to detect pressure information on the transmission rod 622; then the control device 63 can take control of a movement amount of the base 621 in the third preset direction based on the pressure information. For example, during press-fitting the metal mask 3 onto the backboard 2 to be contact there-with in the third preset direction through the conveying device 62, the movement amount of the metal mask 3 in the third preset direction can be adjusted by the control device 63 based on the pressure information as detected by the pressure sensor 626, so that the metal mask 3 can be contacted with the backboard 2 in an uniform manner; in this way, it can avoid, for example, an occurrence of one side of the metal mask 3 is contacted with the backboard 2 while the other side thereof is not.

Figure 6:
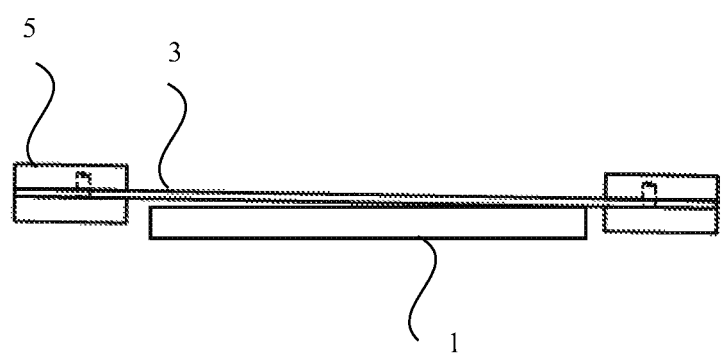
FIG. 6 is a schematic view illustrating the case where a metal mask is not uniformly contacted with a backboard during the operation of the vapor deposition apparatus provided by the embodiment of the invention.

As illustrated in FIG. 6, if a left portion of the metal mask 3 is not contacted with the backboard 2, the control device 63 can control the corresponding conveying device 62 located on at left side to move the corresponding holder 5 downward in the third preset direction, with the aid of the pressure information sent back by the pressure sensor 626 located at the left side. In turn, the metal mask 3 can be brought into contact with the backboard 2.

In an example, the base 621, the first motion mechanism 623, the second motion mechanism 624 and the third motion mechanism 625 are located outside the vacuum chamber 1; one end of the transmission rod 622 is inserted into the vacuum chamber 1, and the other end of the transmission rod 622 is located outside the vacuum chamber 1 and is hermetically connected with an outer wall of the vacuum chamber 1 through a corrugated pipe 7. With such a design, it is possible to drive the holder 5 to move while preventing the corresponding driving component from occupying the internal space of the vacuum chamber 1. Besides, the vacuum chamber 1 can also be put into a sealed state with the aid of the corrugated pipe 7.

Herein it is to be noted that, the first motion mechanism 623, the second motion mechanism 624 and the third motion mechanism 625 each can be implemented in various manners.

In an example, the first motion mechanism 623, the second motion mechanism 624 and the third motion mechanism 625 include at least one of the following configurations.

In a configuration, the first motion mechanism 623 is a first telescopic cylinder, a cylinder body of the first telescopic cylinder is fixed relative to the vacuum chamber 1, and a telescopic rod of the first telescopic cylinder is stretched-out and drawn-back in a direction parallel to the first preset direction.

In a configuration, the second motion mechanism 624 is a second telescopic cylinder, a cylinder body of the second telescopic cylinder is fixed relative to the vacuum chamber 1, and a telescopic rod of the second telescopic cylinder is stretched-out and drawn-back in a direction parallel to the second preset direction.

In a configuration, the third motion mechanism 625 is a third telescopic cylinder, a cylinder body of the third telescopic cylinder is fixed relative to the vacuum chamber 1, and a telescopic rod of the third telescopic cylinder is stretched-out and drawn-back in a direction parallel to the third preset direction.

As above, in the example, it's possible that each of the first motion mechanism 623, the second motion mechanism 624 and the third motion mechanism 625 is a telescopic cylinder; and it's also possible that at least one or two of these motion mechanisms 623, 624, 625 is/are telescopic cylinder(s). Furthermore, the telescopic cylinder can be an oil cylinder or an air cylinder.

In an example, the first motion mechanism 623, the second motion mechanism 624 and the third motion mechanism 625 include at least one of the following configurations.

In a configuration, the first motion mechanism 623 includes a first threaded screw rod in transmission connection with the base 621, an axial line of the first threaded screw rod being parallel to the first preset direction; and a first drive motor that is fixed relative to the vacuum chamber 1 and is in transmission connection with one end of the first threaded screw rod.

In a configuration, the second motion mechanism 624 includes a second threaded screw rod in transmission connection with the base 621, an axial line of the second threaded screw rod being parallel to the second preset direction; and a second drive motor that is fixed relative to the vacuum chamber 1 and is in transmission connection with one end of the second threaded screw rod.

In a configuration, the third motion mechanism 625 includes a third threaded screw rod in transmission connection with the base 621, an axial line of the third threaded screw rod being parallel to the third preset direction; and a third drive motor that is fixed relative to the vacuum chamber 1 and is in transmission connection with one end of the third threaded screw rod.

As above, in the example, it's possible that each of the first motion mechanism 623, the second motion mechanism 624 and the third motion mechanism 625 includes a drive motor and a threaded screw rod; and it's also possible that at least one or two of these motion mechanisms each include(s) a drive motor and a threaded screw rod.

In an example, the above acquiring device is a charge coupled imaging device, which is a semiconductor device capable of converting optical images into digital signals.

The foregoing embodiments are merely used for explaining the technical solution of the present invention, and not intended to limit the present invention; although the present invention is explained in detail with reference to the foregoing embodiments, those of ordinary skill in the art will readily appreciate that many modifications are possible in the foregoing embodiments, or equivalent substitutions are made for part of technical features; however, these modifications or substitutions are not intended to make the essences of the corresponding technical solutions depart from the spirit and the scope of the technical solutions of the embodiments of the present invention.

The present application claims priority of Chinese Patent Application No. 201510364626.5 filed on Jun. 26, 2015 titled "VAPOR DEPOSITION APPARATUS", the disclosure of which is incorporated herein by reference in its entirety as part of the present application.

What is claimed is:

1. A vapor deposition apparatus, comprising a vacuum chamber, at least two movable holders and an alignment system, wherein
   a pedestal, a backboard supported on the pedestal and a metal mask located above the backboard are disposed inside the vacuum chamber, and an anti-plasma coated layer is provided on the metal mask;
   each of the movable holders is configured to clamp an end of the metal mask on which a pulling force can be applied; and
   the alignment system is configured to drive the at least two movable holders to move in at least one direction of a first direction and a second direction that are perpendicular to each other within a plane in parallel to the backboard and a third direction perpendicular to the plane, so as to perform at least one of applying a pulling force on the metal mask and attaching the metal mask onto a preset location of the backboard, the first direction, second direction and third direction are perpendicular to each other, wherein
   the alignment system comprises:
   conveying devices disposed in one-to-one correspondence with the at least two movable holders, each of the conveying devices being configured to drive a corresponding holder to move in at least one direction of the first direction, the second direction and the third direction,
   each of the conveying devices comprises:
   a base;
   a transmission rod having a first end fixedly connected to the base and a second end fixedly connected to the corresponding holder;
   a first motion mechanism mounted on the base, being configured to drive the base to move in the first direction, the first motion mechanism is a first telescopic cylinder, wherein a cylinder body of the first telescopic cylinder is fixed relative to the vacuum chamber, and a telescopic rod of the first telescopic cylinder is stretched-out and drawn-back in a direction parallel to the first direction;
   a second motion mechanism mounted on the base, being configured to drive the base to move in the second direction, the second motion mechanism is a second telescopic cylinder, wherein a cylinder body of the second telescopic cylinder is fixed relative to the vacuum chamber, and a telescopic rod of the second telescopic cylinder is stretched-out and drawn-back in a direction parallel to the second direction; and
   a third motion mechanism mounted on the base, being configured to drive the base to move in the third direction, the third motion mechanism is a third telescopic cylinder, wherein a cylinder body of the third telescopic cylinder is fixed relative to the vacuum chamber, and a telescopic rod of the third telescopic cylinder is stretched-out and drawn-back in a direction parallel to the third direction,
   wherein the first motion mechanism, the second motion mechanism and the third motion mechanism are located outside the vacuum chamber, and one end of the transmission rod is inserted into the vacuum chamber, and the other end of the transmission rod is located outside the vacuum chamber and hermetically connected to an outer wall of the vacuum chamber through a corrugated pine.

2. The vapor deposition apparatus according to claim 1, wherein the alignment system further comprises:
   an acquiring device configured to acquire image information of a first alignment mark preset on the backboard and a second alignment mark preset on the metal mask;
   a control device in signal communication with the acquiring device and each of the conveying devices, the control device being configured to control each of the conveying devices based on the image information and a preset tension value stored in the control device.

3. The vapor deposition apparatus according to claim 2, wherein the acquiring device is a charge coupled imaging device.

4. The vapor deposition apparatus according to claim 1, wherein each of the holders comprises a first splint and a second splint which are disposed in parallel and are coupled by a bayonet and a clasp, the first splint is fixedly connected to the second end of the transmission rod, and the first splint and the second splint are connected detachably, the metal mask is provided with a through-hole mated with the clasp.

5. The vapor deposition apparatus according to claim 1, wherein each of the conveying devices further comprises a pressure sensor in signal communication with the control device, and the pressure sensor is configured to detect a pressure subjected by the transmission rod, and
   the control device is further configured to control a movement amount of the base in the third direction based on the pressure as detected.

6. The vapor deposition apparatus according to claim 1, wherein the at least two movable holders are disposed at opposite sides of the pedestal in pairs.

* * * * *